United States Patent
Jangity (10) Patent No.: US 10,031,867 B2
(45) Date of Patent: Jul. 24, 2018

(54) PULSE-LATCH BASED BUS DESIGN FOR INCREASED BANDWIDTH

(71) Applicant: Ampere Computing LLC, Santa Clara, CA (US)

(72) Inventor: Arun Jangity, Sunnyvale, CA (US)

(73) Assignee: AMPERE COMPUTING LLC, Santa Clara, CA (US)

( * ) Notice: Subject to any disclaimer, the term of this patent is extended or adjusted under 35 U.S.C. 154(b) by 430 days.

(21) Appl. No.: 14/482,780

(22) Filed: Sep. 10, 2014

(65) Prior Publication Data

US 2015/0363352 A1 Dec. 17, 2015

Related U.S. Application Data

(60) Provisional application No. 62/012,173, filed on Jun. 13, 2014.

(51) Int. Cl.
| | |
|---|---|
| *G06F 13/16* | (2006.01) |
| *G11C 5/06* | (2006.01) |
| *G11C 7/10* | (2006.01) |
| *G11C 7/22* | (2006.01) |

(52) U.S. Cl.
CPC .............. *G06F 13/16* (2013.01); *G11C 5/063* (2013.01); *G11C 7/1039* (2013.01); *G11C 7/1048* (2013.01); *G11C 7/222* (2013.01)

(58) Field of Classification Search
CPC ... G06F 13/4022; G06F 13/16; G06F 13/4243
USPC .......... 710/117, 100, 305–306; 713/500–600
See application file for complete search history.

(56) References Cited

U.S. PATENT DOCUMENTS 6,018,778 A * 1/2000 Stolowitz ................ G06F 3/061
 710/52
6,141,274 A * 10/2000 Eto ....................... G11C 7/1039
 365/189.05

* cited by examiner

*Primary Examiner* — Tim T Vo
*Assistant Examiner* — Kim T. Huynh
(74) *Attorney, Agent, or Firm* — Alston & Bird LLP (57) ABSTRACT

A memory bus comprising a plurality of latches arranged sequentially between a source node and a destination node of a channel of the memory bus; and a pulse generator. The pulse generator is operable to generate a sequence of pulses, each sequential pulse to be simultaneously received by the plurality of latches. A pulse is generated for each edge of a clock signal. A first latch of the plurality of latches is operable to pass on a first data sample while a first pulse is received by the first latch of the plurality of latches. A second latch of the plurality of latches is operable to pass on a second data sample towards the first latch of the plurality of latches while the first pulse is simultaneously received by the first and second latches of the plurality of latches.

20 Claims, 7 Drawing Sheets

PULSE-LATCH BASED BUS DESIGN FOR INCREASED BANDWIDTH

CROSS-REFERENCE TO RELATED APPLICATIONS

The present application claims priority to provisional application Ser. No. 62/012,173, filed on Jun. 13, 2014, entitled "PULSE-LATCH BASED BUS DESIGN FOR INCREASED BANDWIDTH" naming the same inventors as in the present application. The contents of the above referenced provisional application are incorporated by reference, the same as if fully set forth herein.

TECHNICAL FIELD

The present disclosure relates generally to the field of memory bus operation and more specifically to the field of improved memory bus bandwidth.

BACKGROUND

Computer systems continue to evolve, with ever faster processing speeds, greater data handling capabilities, and increasing storage capacity. Memory buses also handle increased data density with tighter timing requirements (increased sensitivity to delays caused by an amount of time that a memory controller must wait before a next data bit can be passed to the memory bus).

Figure 1:
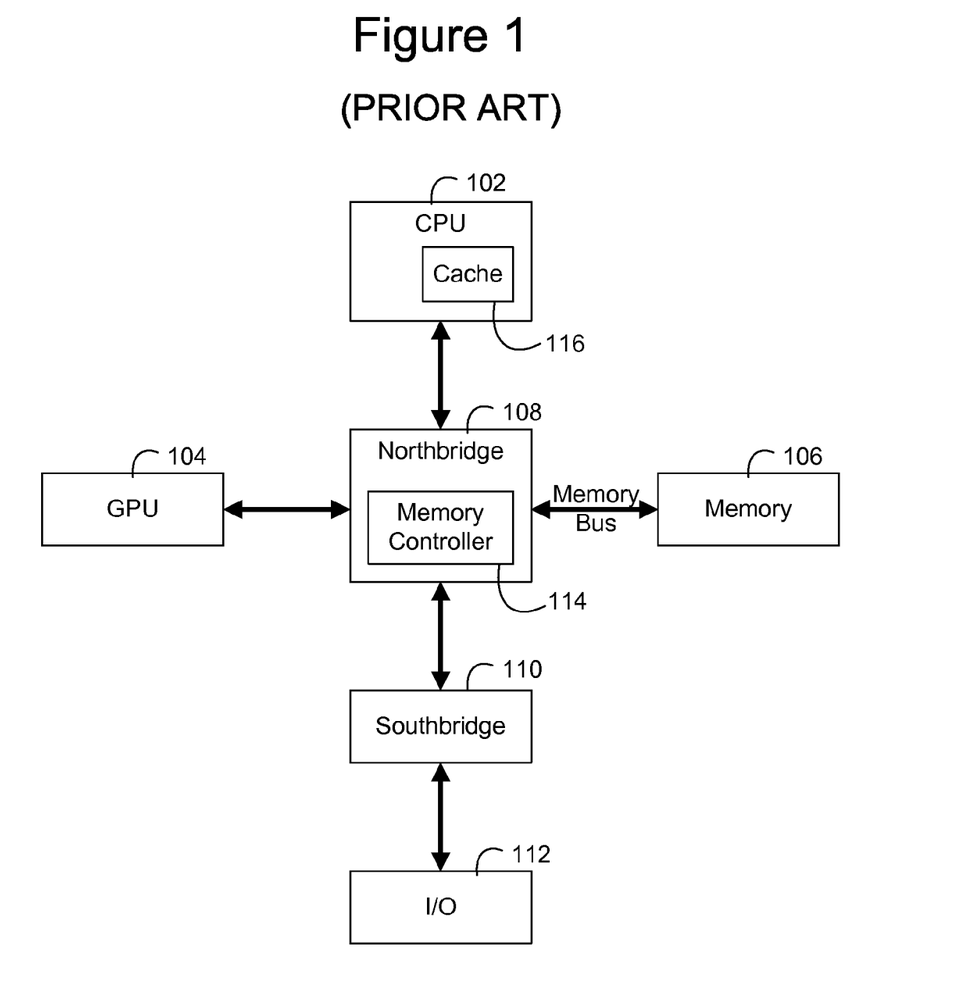
FIG. 1 illustrates a block diagram of an exemplary computer system in accordance with the prior art.

FIG. 1 illustrates an exemplary computer system comprising a central processing unit (CPU) 102 interconnected to a graphics processing unit (GPU) 104, one or more memory modules 106, and a plurality of input/output (I/O) devices 112 through a core logic chipset comprising a Northbridge 108 and a Southbridge 110. As illustrated in FIG. 1, the Northbridge 108 provides a high-speed interconnect between the CPU 102, the GPU 104, and memory modules 106, while the Southbridge 110 provides lower speed interconnections to one or more I/O modules 112. As illustrated in FIG. 1, the interconnection may be implemented with a memory controller 114. Two or more of the CPU 102, GPU 104, Northbridge 108, and Southbridge 110 may be combined in an integrated unit.

One or more graphics cards 104 may be connected to the Northbridge 108 via a high-speed graphics bus (AGP) or a peripheral component interconnect express (PCIe) bus. The one or more memory modules 106 may be connected to the Northbridge 108 via a memory bus. The Northbridge 108 and the Southbridge 110 may be interconnected via an internal bus. Meanwhile, the Southbridge 110 may provide interconnections to a variety of I/O modules 112. The I/O modules 112 may comprise one or more of a PCI bus, serial ports, parallel ports, disc drives, universal serial bus (USB), Ethernet, and peripheral input devices (e.g., keyboard and mouse).

Figure 2A:
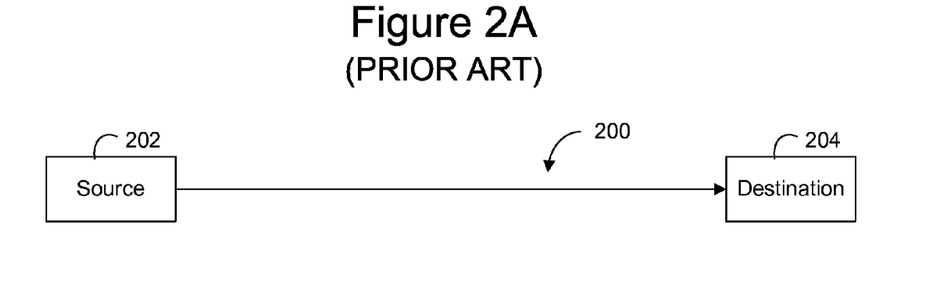
FIG. 2A illustrates a block diagram of an exemplary channel of an exemplary memory bus in accordance with the prior art.
Figure 2B:
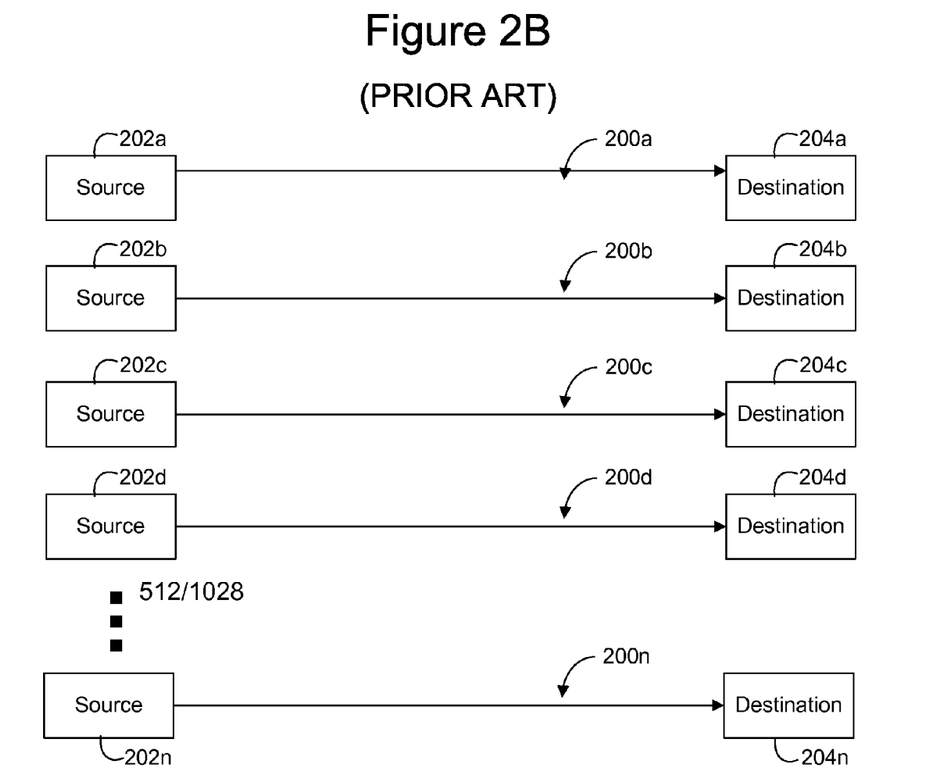
FIG. 2B illustrates a block diagram of an exemplary plurality of channels of an exemplary memory bus in accordance with the prior art.

As illustrated in FIG. 2A, a channel 200 of a memory bus may comprise a source node 202 and a destination node 204. For example, the source node 202 may be part of a memory module 106, a memory controller 114, and a memory cache, while the destination node 204 may also be part of the memory module 106 (when the source node 202 is part of the memory controller 114), the memory controller 114 (when the source node 202 is part of the memory module 106 and the memory cache), and the memory cache (when the source node 202 is part of the memory controller 114). As illustrated in FIG. 2B, a memory bus may also comprise a plurality of channels 200a-200n. As also illustrated in FIG. 2B, a memory bus may comprise 512 or 1028 channels 200. A memory bus may also comprise other quantities of channels 200.

Figure 3:
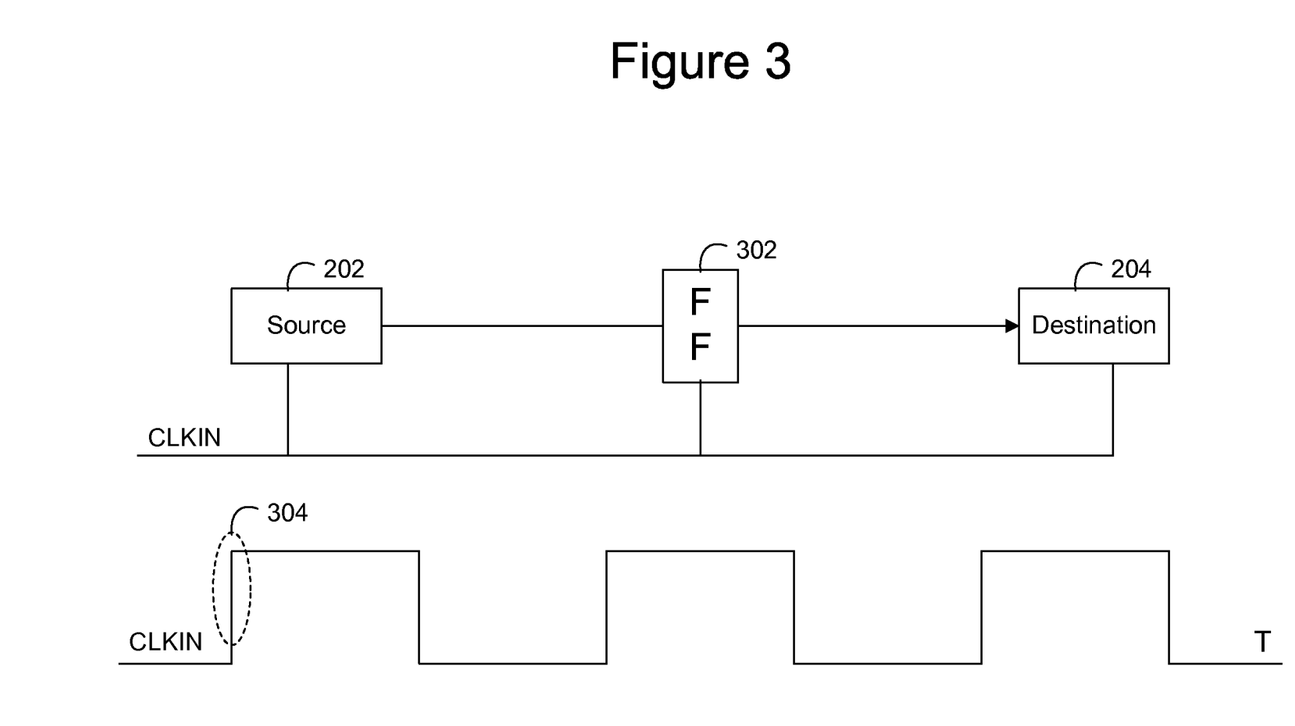
FIG. 3 illustrates an exemplary channel of a memory bus with an exemplary buffer to increase bandwidth in accordance with an embodiment of the present invention.

Because a finite amount of time is needed for a data sample to propagate from a source node 202 to a destination node 204, a next data sample can't be sent down the memory bus until a current data sample has completed its journey down the memory bus. As illustrated in FIGS. 2A and 2B, when a memory bus channel 200 contains no buffering, the data transmission delay comprises the entire propagation delay required for the current data sample to propagate completely through the memory bus. As illustrated in FIG. 3, one solution is to add a buffer 302 into each of the channels 200 of the memory bus, which can cut the propagation delay in half. As soon as the data sample gets past the added buffer 302, a next data sample can be sent. In other words, the source node 202 doesn't have to wait until a first data sample has travelled along the entire length of the memory bus channel 200 before sending a next data sample. Such a buffer 302 may double the memory bus channel bandwidth. As also illustrated in FIG. 3, the buffer 302 may be a flip flop, which samples data when a rising edge 304 of a clock signal is received.

SUMMARY OF THE INVENTION

This present invention provides a solution to the challenges inherent in increasing memory bus efficiency and data bandwidth. In an apparatus according to one embodiment of the present invention, a memory bus with increased bandwidth is disclosed. The memory bus comprises a plurality of latches arranged sequentially between a source node and a destination node of a channel of the memory bus; and a pulse generator. The pulse generator is operable to generate a sequence of pulses, each sequential pulse to be simultaneously received by the plurality of latches. A pulse is generated for each edge of a clock signal. A first latch of the plurality of latches is operable to pass on a first data sample while a first pulse is received by the first latch of the plurality of latches. A second latch of the plurality of latches is operable to pass on a second data sample towards the first latch of the plurality of latches while the first pulse is received by the first and second latches of the plurality of latches.

In a method according to one embodiment of the present invention, a method for transmitting data in a memory bus with increased bandwidth is disclosed. The method comprises generating a sequence of consecutive pulses, each sequential pulse to be simultaneously received by a plurality of latches. The plurality of latches is arranged sequentially between a source node and a destination node of a channel of the memory bus. A pulse is generated for each edge of a clock signal. The method further comprises passing on a first data sample from a first latch while a first pulse is received by the first latch. Lastly, the method further comprises passing a second data sample towards the first latch while the first pulse is received by the first latch.

In another apparatus according to a further embodiment of the present invention, a memory bus with increased bandwidth is disclosed. The memory bus comprises a plurality of channels, each channel comprising a respective plurality of latches, and at least one pulse generator. Each channel comprises a source node and a destination node. Each respective plurality of latches is arranged sequentially between a respective source node and a respective destination node. The at least one pulse generator is operable to generate a sequence of pulses, each sequential pulse to be simultaneously received by the pluralities of latches of at least one channel of the plurality of channels. A pulse is generated for each edge of a clock signal. A first latch of the plurality of latches is operable to pass on a first data sample while a first pulse is received by the first latch of the plurality of latches. A second latch of the plurality of latches is operable to pass on a second data sample towards the first latch of the plurality of latches while the first pulse is received by the first and second latches of the plurality of latches.

BRIEF DESCRIPTION OF THE DRAWINGS

Embodiments of this present invention will be better understood from the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide solutions to the increasing challenges inherent in increasing memory bus bandwidth. Various embodiments of the present disclosure provide an increased memory bus bandwidth without requiring an increase in clock frequency. As discussed in detail below, buffers are placed into memory bus channels. These buffers are latches which are triggered to pass sampled data by pulses that are generated by a pulse generator that produces a pulse for each edge of the clock signal, such that a bandwidth and an apparent clock frequency is doubled without having to change the clock signal frequency.

Figure 4:
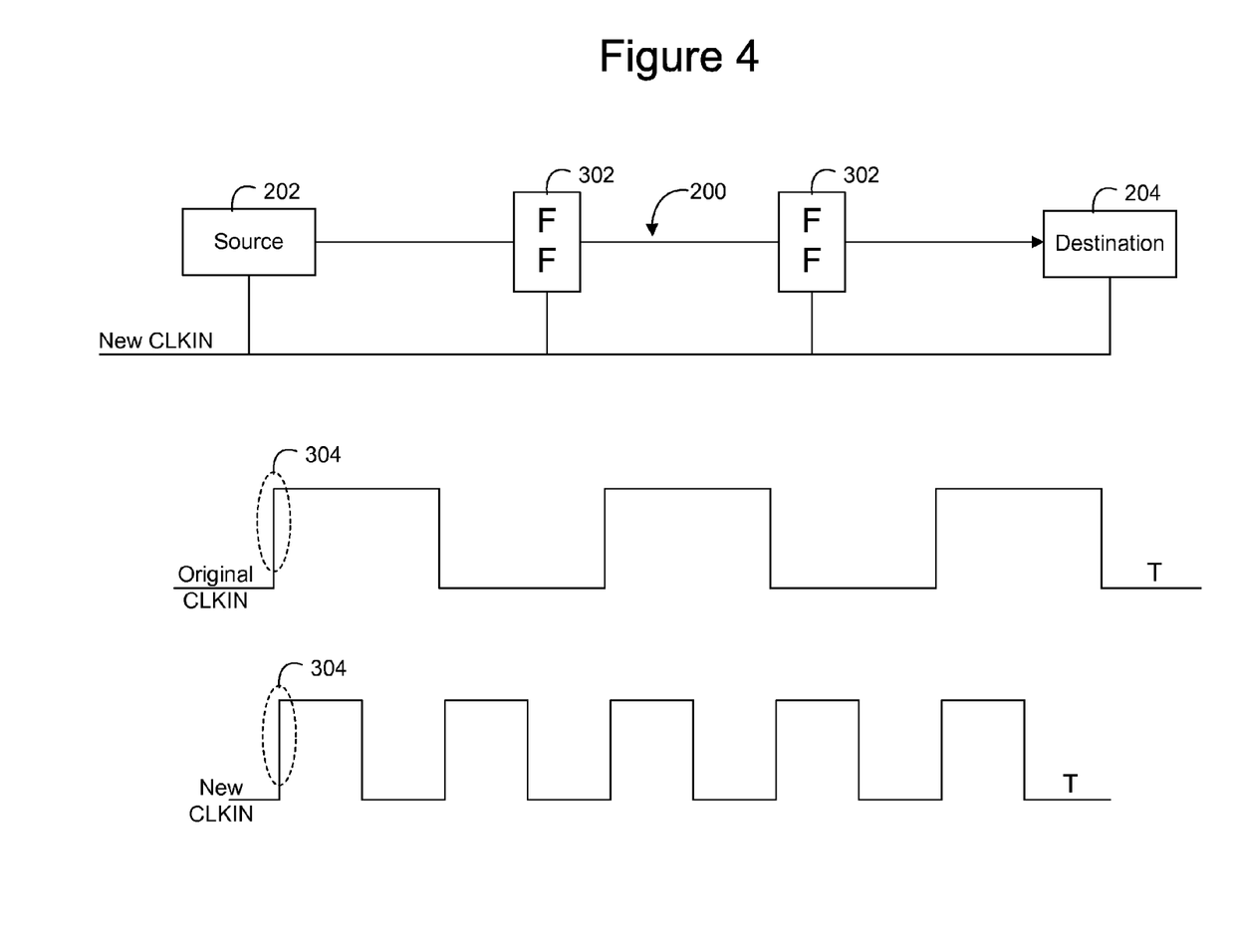
FIG. 4 illustrates an exemplary channel of a memory bus with a pair of exemplary buffers operating at an increased clock frequency to increase bandwidth in accordance with an embodiment of the present invention.

Buffering Memory Bus Channels to Increase Bus Bandwidth:

As illustrated in FIG. 4, if an increase in bandwidth is desired for a memory bus channel 200 that already has a first buffer (e.g., a flip-flop) 302, a second flip flop 302 may be added to the memory bus channel 200. However, as illustrated in FIG. 4, when additional flip flops 302 are added to memory bus channels 200, the original clock signal (CLKIN) frequency will need to be increased. As illustrated in FIG. 4, the original clock signal (CLKIN) frequency has been doubled.

Figure 5A:
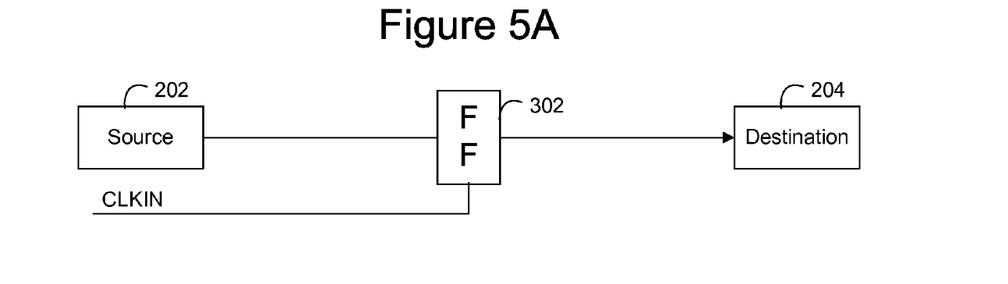
FIG. 5A illustrates the exemplary channel of the memory bus, as illustrated in FIG. 3, in accordance with an embodiment of the present invention.
Figure 5B:
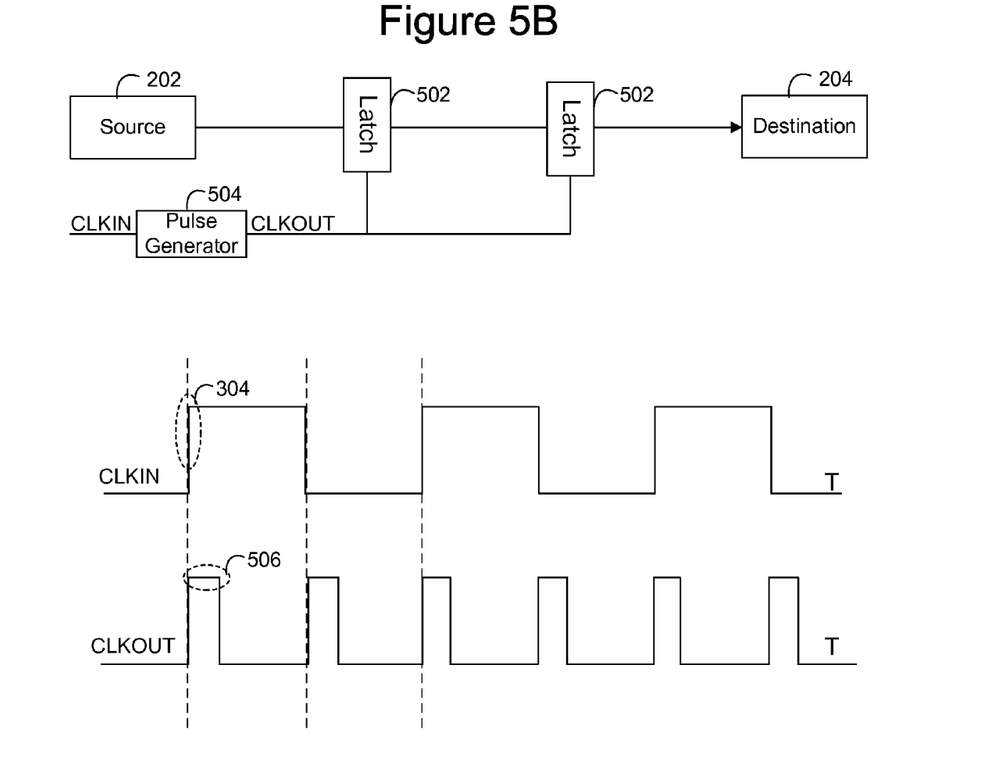
FIG. 5B illustrates an exemplary channel of a memory bus with a pair of exemplary latches that receive pulses from a pulse generator at a frequency twice the clock frequency in accordance with an embodiment of the present invention.

In one exemplary embodiment, as illustrated in FIGS. 5A and 5B, a flip flop 302 may be replaced with a pair of latches 502. Because a conventional flip flop comprises a pair of latches, the replacement of the original flip flop 302 with the exemplary latches 502 will not require an increase in logic. As illustrated in FIG. 5B, the original clock signal (CLKIN) is received by a pulse generator 504 that outputs a pulse signal (CLKOUT) with a frequency twice the frequency of the original clock signal (CLKIN) frequency. A pulse 506 is generated for each edge of the clock signal (CLKIN) (both rising edges and falling edges). As also illustrated in FIG. 5B, instead of the conventional sampling of the data when a rising edge 304 is detected, the latches 502 pass a current data sample while a pulse 506 is being received.

Figure 6:
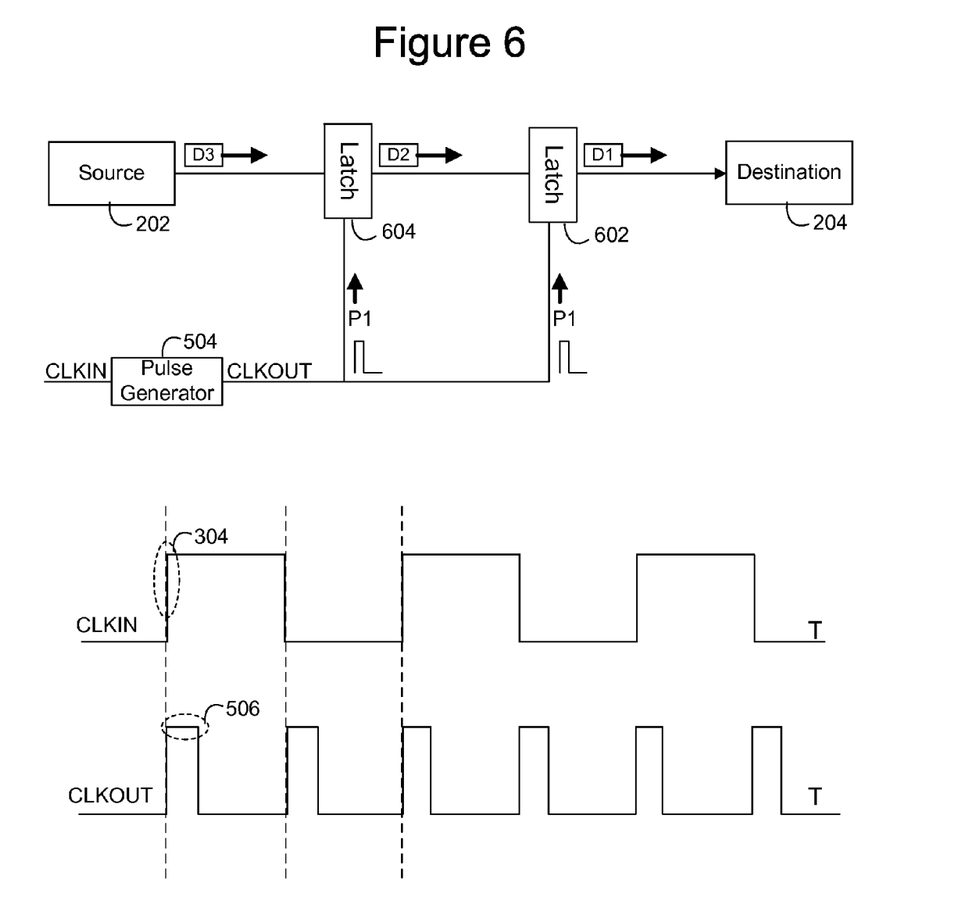
FIG. 6 illustrates a block diagram of a memory bus channel illustrating an increased bandwidth where a plurality of data samples are passed into the memory bus channel at the same time.

As illustrated in FIG. 6, when a first pulse (P1) from the pulse generator 504 is received by a first latch 602, a first data sample (D1) is passed by the first latch 602 and towards the destination node 204. The first pulse (P1) is also simultaneously received by a second latch 604. When the second latch 604 receives the first pulse (P1), a second data sample (D2) is passed by the second latch 604 and towards the first latch 602. Finally, as also illustrated in FIG. 6, when the second latch 604 passes the second data sample (D2) towards the first latch 604, a third data sample (D3) may be released by the source node 202 into the memory bus channel 200 to be received by the second latch 604. As illustrated in FIG. 6, because of the pair of buffers (e.g., latches 602, 604), the original bandwidth of a memory bus channel 200 (a single data sample) may be tripled to three data samples.

Figure 7:
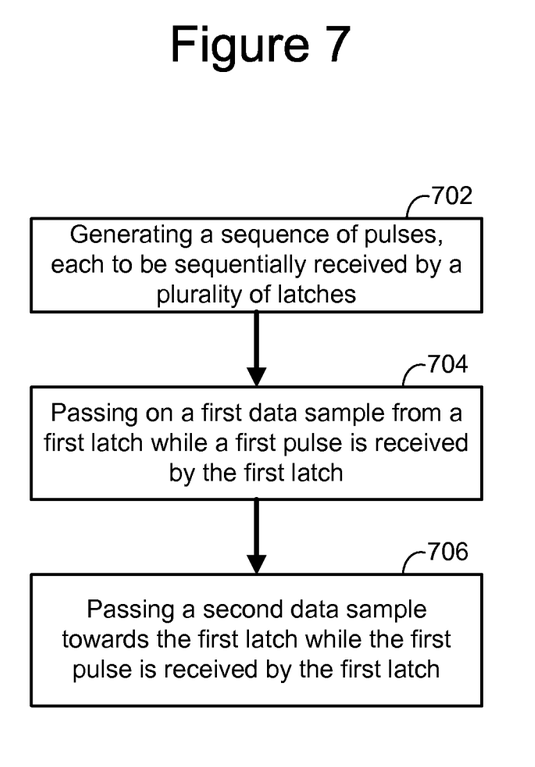
FIG. 7 illustrates a flow diagram, illustrating the steps to a method in accordance with an embodiment of the present invention.

FIG. 7 illustrates the steps to an exemplary process for increasing a bandwidth of a memory bus channel. In step 702 of FIG. 7, a sequence of pulses is generated. Each pulse of the sequence of pulses is simultaneously received by each of a plurality of buffers of a memory bus channel. In one embodiment, each memory bus channel comprises a separate pulse generator to generate the sequence of pulses. In another embodiment, a plurality of memory bus channels share a pulse generator, such that each latch of the plurality of memory bus channels simultaneously receives each sequential pulse of the sequence of pulses.

In step 704 of FIG. 7, a first data sample is passed from a first latch when a first pulse is received by the first latch. In step 706 of FIG. 7, and as also illustrated in FIG. 6, a second data sample is passed from a second latch when the first pulse is also received by the second latch. The first pulse is simultaneously received by the first and second latches.

Additional Benefits of Pulse-Latching Memory Bus Channel Buffers:

In one embodiment, the exemplary pulsed latches as described herein, are able to absorb variations in the pulses and in the timing of the data samples. Replacing flip flops with pulsed latches also benefits because a conventional flip flop has to follow a standard timing pattern for normal flip flop operation. For example, a conventional flip flop samples data when triggered by a rising edge of the clock signal. Furthermore, a flip flop has to meet a minimum setup time. An exemplary setup time is a minimum amount of time that a data signal should be held at a flip flop before the rising edge of the clock signal is received. In one embodiment, an exemplary flip flop captures a "D" input value during a rising edge of the clock signal and produces a "Q" output value.

A complication for flip flop timing considerations is that the clock signal and the data timing are both moving around and are not always synchronized. The exemplary conventional flip flop captures (samples) on the rising edge and has to achieve the setup time requirement (to make sure that the data is there to be sampled during the rising edge). However, if the data signal is randomly late or the rising edge of the clock signal is randomly early, the clock signal frequency may be reduced to ensure that any randomness of the data signal arrival and any randomness of the arrival time of the clock signal rising edge are absorbed by the flip flop to ensure that each memory bus channel reliably passes through a data sample for each rising edge of the clock signal. Such a reduction in clock signal frequency may result in a loss of 10-15% of the original frequency. An advantage of a pulsed latch system is that the latches pass through whatever data sample they are currently holding. Furthermore, rather than only a narrow rising edge (a flip flop's output only changes when there is a one of a rising or falling edge of the clock signal), the data samples are passed through the latch during a pulse duration (that is, a latch is level sensitive and when enabled (by a pulse) becomes transparent allowing any data sample that is received during the pulse to be passed on by the latch. Because a pulsed latch system is able to absorb variations in clock and data timing without having to resort to lowering the clock frequency, the memory bus will run faster than with flip flop buffers.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A memory bus comprising:
    a plurality of latches arranged sequentially in an individual channel of the memory bus, wherein said memory bus is coupled between a source node and a destination node of; and
    a pulse generator operable to generate a sequence of pulses, wherein said pulse generator is configure to: generate a pulse of said sequence of pulses responsive a rising edge of a clock signal in a clock cycle; and generate another pulse of said sequence of pulses responsive a falling edge of said clock signal in said clock cycle, wherein the pulse generator is coupled to said plurality of latches, wherein a respective pulse of the sequence of pulses is simultaneously received by the plurality of latches, wherein: responsive to a first pulse in the sequence of pulses, a first latch of the plurality of latches is configured to pass on a first data sample stored therein along the individual channel; and a second latch of the plurality of latches is configured to pass on a second data sample stored therein along the individual channel to the first latch for storing responsive to the first pulse.

2. The memory bus of claim 1, wherein each individual channel of the memory bus comprises a separate pulse generator.

3. The memory bus of claim 1, wherein a plurality of channels of the memory bus share said pulse generator.

4. The memory bus of claim 1, wherein a bandwidth of the memory bus is proportional to a number of latches between the source node and the destination node of the memory bus, and wherein a frequency of the clock signal remains constant regardless of the number of latches.

5. The memory bus of claim 1, wherein each latch of the plurality of latches is operable to simultaneously receive and pass on a respective data sample as synchronized by the sequence of pulses.

6. The memory bus of claim 1, wherein the source node of the memory bus is part of one of a memory controller, a memory module, and a cache memory, and wherein the destination node of the memory bus is part of one of a remaining memory module, memory controller, and cache memory.

7. The memory bus of claim 4, wherein a delay before a next data sample is transmitted by the source node is related to the number of latches of the individual channel that are disposed between the source node and the destination node of the memory bus.

8. A method for transmitting data in a memory bus, the method comprising:
   generating a sequence of pulses, wherein each pulse is simultaneously received by a plurality of latches, wherein the plurality of latches are arranged sequentially between a source node and a destination node of an individual channel of the memory bus, and wherein the generating comprises generating a pulse of said sequence of pulses responsive a rising edge of a clock signal in a clock cycle; and generating another pulse of said sequence of pulses responsive a falling edge of said clock signal in said clock cycle;
   passing on a first data sample from a first latch of the plurality of latches responsive to a first pulse of the sequence of pulses; and
   passing on a second data sample from a second latch of the plurality of latches to the first latch for storing responsive to the first pulse.

9. The method of claim 8 further comprising generating a separate sequence of pulses for each individual channel of the memory bus.

10. The method of claim 8 further comprising generating a sequence of pulses that are shared by a plurality of channels of the memory bus.

11. The method of claim 8, wherein a bandwidth of the memory bus is proportional to a number of latches on the individual channel between the source node and the destination node of the memory bus, and wherein a clock signal frequency remains constant and is independent of the number of latches.

12. The method of claim 8, wherein each latch of the plurality of latches simultaneously receives and passes on a respective data sample as synchronized by the sequence of pulses.

13. The method of claim 8, wherein the source node of the memory bus is part of one of a memory controller, a memory module, and a cache memory, and wherein the destination node of the memory bus is part of one of the memory module, the memory controller, and the cache memory.

14. The method of claim 11, wherein a delay before a next data sample to be transmitted by the source node is related to the number of latches of the individual channel between the source node and the destination node of the memory bus.

15. A memory bus comprising:
   a plurality of channels, each individual channel of the plurality of channels coupled to a source node and a destination node, wherein each individual channel of the plurality of channels comprises a plurality of latches arranged sequentially between a corresponding source node and a destination node; and
   at least one pulse generator operable to generate a sequence of pulses, wherein the at least one pulse generator is configured to generate a pulse of said sequence of pulses responsive a rising edge of a clock signal in a clock cycle; and generate another pulse of said sequence of pulses responsive a falling edge of said clock signal in said clock cycle, wherein each pulse of the sequence of pulses is simultaneously received by the pluralities of latches of the individual channel, wherein a first latch of the plurality of latches is operable to pass on a first data sample stored therein responsive to a first pulse of the sequence of pulses, and wherein a second latch of the plurality of latches is operable to pass on a second data sample stored therein to the first latch for storing responsive to the first pulse.

16. The memory bus of claim 15, wherein each individual channel of the memory bus comprises a separate pulse generator.

17. The memory bus of claim 15, wherein a plurality of channels of the memory bus share a pulse generator.

18. The memory bus of claim 15, wherein a bandwidth of the memory bus is proportional to a number of latches of the individual channel between the source node and the destination node of a channel of the memory bus, wherein a delay before a next data sample may be transmitted by the source node is related to the number of latches between the source node and the destination node of the channel of the memory bus, and wherein a frequency of the clock signal is independent of the number of latches.

19. The memory bus of claim 15, wherein each latch of the plurality of latches of an individual channel is operable to simultaneously receive and pass on a respective data sample as synchronized by the sequence of pulses.

20. The memory bus of claim 15, wherein the source node of the memory bus is part of one of a memory controller, a memory module, and a cache memory, and wherein the destination node of the memory bus is part of one of the memory module, the memory controller, and the cache memory.

* * * * *